(12) United States Patent
Leutschacher et al.

(10) Patent No.: US 9,933,476 B2
(45) Date of Patent: Apr. 3, 2018

(54) PROBE CARD AND METHOD FOR PERFORMING AN UNCLAMPED INDUCTIVE SWITCHING TEST USING MULTIPLE EQUAL-LENGTH INTERCONNECTION LINES EMANATING FROM A COMMON CONNECTION NODE

(71) Applicant: Infineon Technologies Austria AG, Villach (AT)

(72) Inventors: Michael Leutschacher, Finkenstein (AT); Norbert Rieser, Millstatt (AT)

(73) Assignee: Infineon Technologies Austria AG, Villach (AT)

( * ) Notice: Subject to any disclaimer, the term of this patent is extended or adjusted under 35 U.S.C. 154(b) by 80 days.

(21) Appl. No.: 14/817,829

(22) Filed: Aug. 4, 2015

(65) Prior Publication Data

US 2016/0041220 A1    Feb. 11, 2016

(30) Foreign Application Priority Data

Aug. 5, 2014   (DE) .................. 10 2014 111 102

(51) Int. Cl.
*G01R 31/00*   (2006.01)
*G01R 31/26*   (2014.01)
*G01R 1/04*    (2006.01)

(52) U.S. Cl.
CPC ....... *G01R 31/2621* (2013.01); *G01R 1/0408* (2013.01); *G01R 31/2601* (2013.01)

(58) Field of Classification Search
CPC ............ G01R 1/07342; G01R 31/2608; G01R 1/06705; G01R 1/0408; G01R 1/067; G01R 1/06777; G01R 1/07307; G01R 1/07314; G01R 1/44; G01R 31/26; G01R 31/2648; G01R 31/2865; G01R 31/2886; G01R 31/318513; G01R 31/016; G01R 31/2635; G01R 31/2893; G01R 35/005; G01R 31/31926; G01R 31/2621; G01R 1/36; G01R 31/2831; G01R 31/327; G01R 31/2879; G01R 1/06766; G01R 31/129; G01R 31/275; G01R 31/2601; G01R 31/2851; G01R 31/2887; H01L 22/34; H01L 27/0688; H01L 2924/1306; H01L 2924/19107

See application file for complete search history.

(56) References Cited

U.S. PATENT DOCUMENTS 5,486,770 A *  1/1996  Johnson ............. G01R 1/06772
                                                        324/755.02
7,564,252 B2 * 7/2009  Kamahori .......... G01R 1/07342
                                                        324/715

(Continued)

FOREIGN PATENT DOCUMENTS

EP           0729034 A2     8/1996

*Primary Examiner* — Vinh Nguyen
(74) *Attorney, Agent, or Firm* — Murphy, Bilak & Homiller, PLLC (57) ABSTRACT

A probe card with a ground contact, a first contact element and a second contact element is provided. The first contact element is coupled to an interconnection node via a first interconnection line having a definite length and the second contact element is coupled to the interconnection node via a second interconnection line having the same definite length. The interconnection node is directly connected to the ground contact.

11 Claims, 6 Drawing Sheets

(56) References Cited

U.S. PATENT DOCUMENTS

| | | | | |
|---|---|---|---|---|
| 7,924,035 B2* | 4/2011 | Huebner | .......... | G01R 31/31926 |
| | | | | 324/754.01 |
| 9,097,759 B2* | 8/2015 | Keller | ...................... | G01R 1/36 |
| 2003/0219913 A1 | 11/2003 | Pourkeramati et al. | | |
| 2007/0182435 A1* | 8/2007 | Lui | .................... | G01R 31/2621 |
| | | | | 324/762.09 |
| 2008/0061803 A1* | 3/2008 | Lane | .................... | G01R 27/205 |
| | | | | 324/715 |
| 2008/0290882 A1* | 11/2008 | Rogers | ..................... | G01R 1/36 |
| | | | | 324/755.11 |
| 2013/0027067 A1* | 1/2013 | Schwartz | ........... | G01R 31/2621 |
| | | | | 324/750.01 |

* cited by examiner

PROBE CARD AND METHOD FOR PERFORMING AN UNCLAMPED INDUCTIVE SWITCHING TEST USING MULTIPLE EQUAL-LENGTH INTERCONNECTION LINES EMANATING FROM A COMMON CONNECTION NODE

PRIORITY CLAIM

This application claims priority to German Patent Application No. 10 2014 111 102.8, filed on 5 Aug. 2014, the content of said German application incorporated herein by reference in its entirety.

TECHNICAL FIELD

The invention generally relates to probe cards and more specifically to probe cards allowing an unclamped inductive switching test on a wafer. The invention further relates to a method for performing an unclamped inductive switching test on a wafer.

BACKGROUND

An unclamped inductive switching (UIS) test allows investigating a dynamic avalanche failure behavior of power devices. Power devices are e.g. power MOSFETs (Metal Oxide Semiconductor Field Effect Transistor) and IGBTs (Insulated Gate Bipolar Transistor). Power devices are frequently used in switched power supplies. Many loads driven today are inductive in nature such as solenoids, transformers, inductors and so on. A power device switching an inductive load experiences a high current flowing. So-called "rugged devices" can be designed to withstand these currents. To detect technological weaknesses of power semiconductors, for example latch-up effects or defect densities, power semiconductors may undergo an UIS test in a test facility.

During an UIS test, an electrical current flows through a power device under test (DUT) and an inductive load coupled thereto. When a predefined current level is reached, the device under test is switched off. The energy stored in the inductive load needs to be dissipated in the power device.

As an example, the device under test may be a power MOSFET. During an UIS test, the drain to source channel as a current channel of the power MOSFET transistor is forced into an avalanche breakdown after switching off due to an inductive load. A voltage snap back because of a technological weakness may destroy the power MOSFET during the avalanche breakdown. In other words, power devices are tested by an UIS test for their capability to withstand energy dissipation in the breakdown mode.

An UIS test may be effectuated on a final, i.e. packaged component. However, for example, systems comprising logical chips and power chips in one package should not undergo the UIS test after packaging because the UIS test may damage the logical chip.

For this and other reasons there is a need for the present invention.

SUMMARY

A probe card comprises a ground contact, an interconnection node directly connected to the ground contact; a first contact element configured to contact a first contact pad on a wafer, the first contact element coupled to the interconnection node via a first interconnection line having a definite length; and a second contact element configured to contact a second contact pad on the wafer, the second contact element coupled to the interconnection node via a second interconnection line having the same definite length as the first interconnection line.

According to a method for performing an unclamped inductive switching test, a wafer comprising a power device structure is provided, wherein the power device structure comprises separate current input areas for a common current channel. Further provided is a probe card that comprises a ground contact, an interconnection node directly connected to the ground contact, a first contact element configured to contact a first contact pad on a first current input area of the separate current input ports of the power device structure, the first contact element coupled to the interconnection node via a first interconnection line having a definite length, a second contact element configured to contact a second contact pad on a second current input area of the separate current input ports of the power device structure, and the second contact element coupled to the interconnection node via a second interconnection line having the same definite length as the first interconnection line. The first and second contact elements are brought into contact with the first contact pad and the second contact pad, respectively, and the power device is switched.

In another embodiment, a method for performing an unclamped inductive switching test on a wafer is provided. The method comprises symmetrically connecting a plurality of separate current input areas of a power device on the wafer via contact elements of a probe card to an interconnection node provided on the probe card, and coupling the interconnection node to a ground contact provided on the probe card.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this description. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION

In the following, embodiments are described with reference to the drawings wherein like reference numerals are generally utilized to refer to like elements throughout. In the following description, for purposes of explanation, numerous specific details are set forth in order to provide a thorough understanding of one or more aspects of embodiments. However, it may be evident to a person skilled in the art that one or more aspects of the embodiments may be practiced with a lesser degree of these specific details. The following description is therefore not to be taken in a limiting sense, and the scope of protection is defined by the appended claims.

The various aspects summarized may be embodied in various forms. The following description shows by way of illustration various combinations and configurations in which the aspects may be practiced. It is understood that the described aspects and/or embodiments are merely examples and that other aspects and/or embodiments may be utilized and structural and functional modifications may be made without departing from the scope of the present disclosure. In addition, while a particular feature or aspect of an embodiment may be disclosed with respect to only one of several implementations, such feature or aspect may be combined with one or more other features or aspects of the other implementations as it may be desired and advantageous for any given or particular application. Further, to the extent that the terms "include", "have", "with" or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Figure 1:
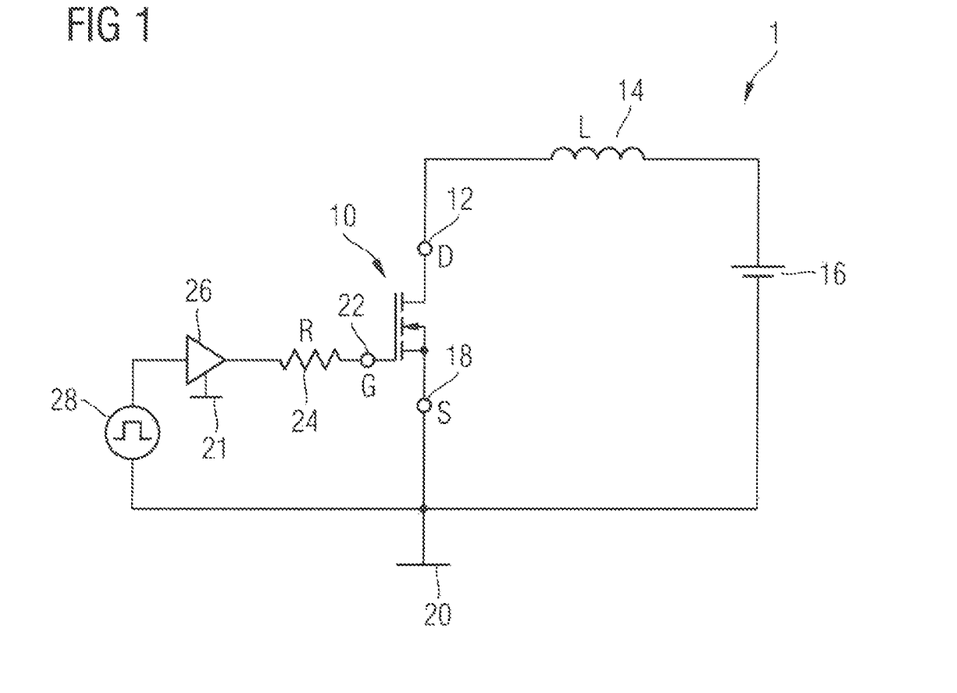
FIG. 1 schematically illustrates a circuit for performing an unclamped inductive switching test.

FIG. 1 shows an exemplary test circuit 1 for carrying out an UIS testing of a power device. A power MOSFET 10 as an exemplary device under test is coupled with a drain contact 12 to a first lead of an inductor 14. The inductor 14 is, e.g., coupled with a second lead to a first contact of a current source 16. The current source 16 may be coupled with a second contact to a source contact 18 of transistor 10 and to a ground potential 20. A gate contact 22 of power MOSFET 10 may be coupled via a resistor 24 to an output of an amplifier 26. An input of the amplifier 26 may be coupled to a pulse generator 28. The pulse generator 28 may also be coupled to the ground potential 20. Amplifier 26 may be coupled to a ground contact 21.

Current source 16 may be configured to inject a current of about several tenths of amperes or more into the device under test. Current source 16 may be configured to inject a current of e.g. about 40 A or less or more. The current source 16 may be configured to inject a current which corresponds to a current for which the device under test is specified.

A voltage applied between source contact 18 and drain contact 12 may, e.g., be of about several tenths of volts or less or more. The voltage applied between the source contact 18 and the drain contact 12 may be of about 35 V or less or more. The voltage applied between source contact 18 and drain contact 12 may correspond to the voltage for which the device under test is specified.

Pulse generator 28 may be configured to apply a single pulse to gate contact 22. Pulse generator 28 may be configured to apply repetitive pulses to gate contact 22. Pulse generator 28 may be configured to generate pulses with a very fast rising and a very fast falling edge.

Amplifier 26 may be a gate driver. Gate driver 26 may be configured to drive a gate of the device under test. Gate driver 26 may be configured to accept a low power input from pulse generator 28 and to produce a high current drive output for the gate of power transistor 10. Gate driver 26 may comprise a level shifter. The gate driver 26 may be configured to charge respectively discharge a gate capacitor of the device under test rapidly with a voltage $V_{DD}$. Amplifier 26 may be provided with a ground contact 21 for rapid charging/discharging. The charge/discharge current passes through resistor 24. An amplitude of the pulses output by amplifier 26 may be configured to a gate voltage necessary to switch the power MOSFET 10. During an UIS test, the device under test may be switched once, or switch cycles may be performed.

Inductance 14 represents an inductive load used for the UIS test.

Although circuit 1 shows a power MOSFET as device under test, it is to be understood that testing e.g. an IGBT is also possible with circuit 1. In this case, a gate of an IGBT is coupled to gate contact 22, a collector of the IGBT is coupled to drain contact 12 and an emitter of the IGBT is coupled to source contact 18. More generally, a control electrode may be coupled to gate contact 22 and a current channel may be coupled between drain contact 12 and source contact 18.

Figure 2:
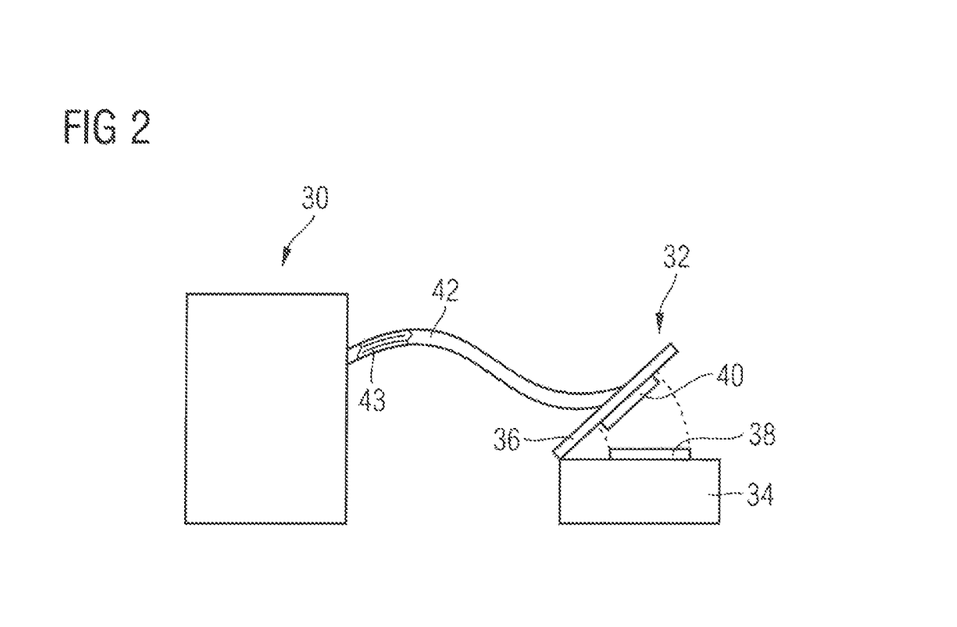
FIG. 2 schematically illustrates a wafer tester including a test fixture into which a wafer to be tested and a probe card may be inserted.

FIG. 2 shows schematically an exemplary wafer tester 30 with a test fixture 32. Wafer tester 30 may be used to perform an UIS test according to test circuit 1. Test fixture 32 comprises a base 34 and a cover 36 which may be pivotally fixed to base 34. Base 34 may be configured to support a wafer 38 to be tested. Base 34 may comprise displacement means for moving wafer 38 in translational direction or rotationally. The displacement means may be configured to position wafer 38 exactly. Cover 36 may be configured to support a probe card 40. When closing cover 36 probe card 40 or more precisely contact elements of the probe card 40 may come into contact with contact pads of wafer 38. It is to be understood that base 34 and cover 36 may be realized in any other form. Wafer tester 30 and cover 36 may be coupled to each other via a flexible electrical cable 42 which may comprise a plurality of electrical lines 43. Flexible cable 42 may have a length of several meters allowing the wafer tester 30 to be placed remote from the test fixture 32.

Wafer tester 30 may output a plurality of different electrical signals. More specifically, a test program may run on wafer tester 30 to control output of the electrical signals at a plurality of signal outputs of wafer tester 30. The test program may define voltage, current, frequency etc. of the electrical signals.

Probe card 40 may comprise a plurality of contact elements. The contact elements may be realized in the form of probe needles. The contact elements may be made e.g. from a spring wire which is tapered to a point at one end and bent down at a steep angle to form a probe tip. A probe needle may be hold by an epoxy ring. The probe needles may be of the cantilever type. For performing an unclamped inductive switching test, the probe needles or contact elements may be configured to carry a high electrical current. They may, for example, be configured to carry a current between, e.g., about 5 Amperes and about 6 Amperes. They may be configured to carry a lower or a higher current as mentioned above. Probe needles which are configured to carry a high current may be called force needles. Probe needles which cannot necessarily carry a high current may be referred to as sensing probes. Sensing probes or sensing probe needles may be used to sense whether the force needles are contacting contact pads of the wafer with a sufficiently low resistance. A four-terminal sensing, also known as Kelvin sensing, may be performed using force needles for injecting current and sensing needles for voltage sensing to ensure a good contact of the force needles.

Probe card 40 may be configured in size and form to wafer 38. Probe card 40 may have any desired form. Probe card 40 may be configured to measure one integrated electrical circuit or one chip or die at a time on a wafer. Probe card 40 may also be configured to measure a plurality of circuits or chips or dies on the wafer 38 at the same time. Probe card 40 may comprise test circuitry configured specifically to the wafer to be tested and the test to be performed. Probe card 40 may be configured to perform an UIS test on a power device. Probe card 40 may also comprise a ground contact which is not shown in FIG. 2.

Injecting a high current into a power semiconductor may require use of specially configured power semiconductor probe cards 40. Technologies used for power probe cards 40 may comprise, e.g., blade, epoxy ring and membrane technologies as well as a buckling beam technology.

Figure 3:
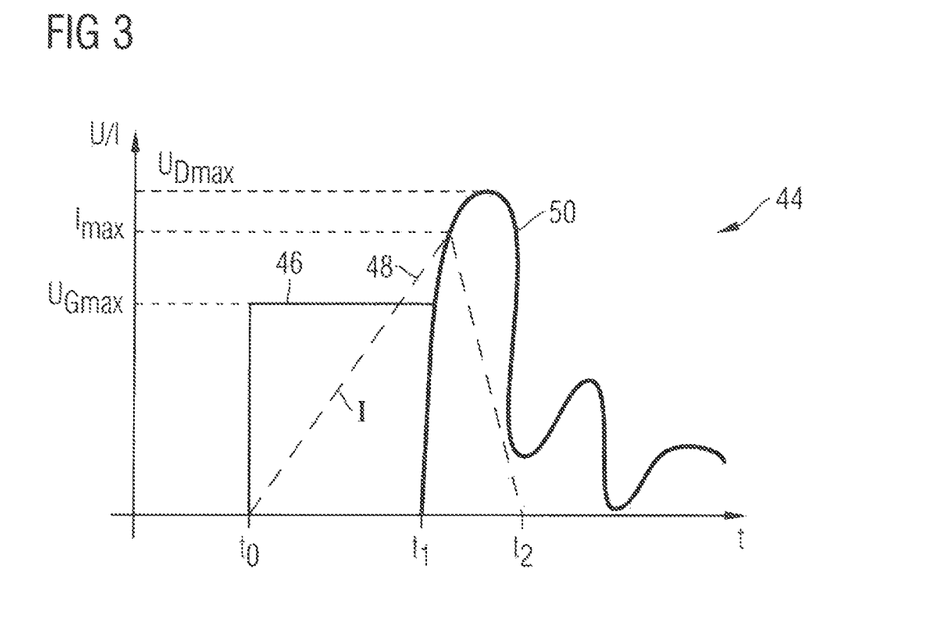
FIG. 3 is a graph schematically illustrating voltage and current curves during an UIS test.

FIG. 3 shows in a graph 44 different voltage curves and current curves as they may occur during UIS testing using e.g. the test circuit shown in FIG. 1. A curve 46 shows in a continuous line a gate voltage $U_G$ which may be applied to gate contact 22 of transistor 10. The gate voltage $U_G$ has a value of "0" at a time smaller than $t_0$. At a time $t_0$, pulse generator 28 generates a pulse. Gate driver 26 may be designed to provide a high current which rapidly charges a gate capacitor of transistor 10. Gate voltage $U_G$ as shown in line 46 rises abruptly to a gate voltage $U_{Gmax}$ which is sufficient to switch the transistor 10 to an open state. A current I starts flowing in the current channel between source contact 18 and drain contact 12 of transistor 10. The current I is exemplarily shown in FIG. 3 in a broken line 48. The current I rises approximately linearly until a current $I_{MAX}$ is reached. The defined maximum current $I_{MAX}$ may be a predefined UIS current for the device under test. Reaching of maximum current $I_{MAX}$ may be sensed by a sensing circuitry which is not shown in FIG. 1. The maximum current $I_{MAX}$ is reached at a time $t_1$. At the time $t_1$ pulse generator 28 is turned off, the gate voltage falls to zero and the transistor 10 switches off. Transistor 10 is switched off immediately and the gate voltage UG falls immediately to zero. The device under test, i.e. the transistor 10 enters a so-called dynamic avalanche breakdown mode. Instead of dynamic avalanche breakdown also the wording forced avalanche breakdown may be used.

The inductance 14, as shown in FIG. 1, has stored energy which is now dissipated on the device under test during a time period between the time $t_1$ and a time $t_2$. This means that a current is still flowing. FIG. 3 shows in a bold line 50 the drain voltage during avalanche breakdown. The drain voltage rises rapidly up to a high level $U_{Dmax}$. A rising flank of line 50, i.e. dU/dt is about several nano-seconds. The duration for the switching flank may e.g. be about 50 ns. The time period $\Delta t=t_2-t_1$ may e.g. be about one to several microseconds. The time $\Delta t=t_2-t_1$ may e.g. be between about 5 and 10 μs. In case of a faulty device the avalanche breakdown leads to a short circuit and the transistor may be damaged.

Figure 4:
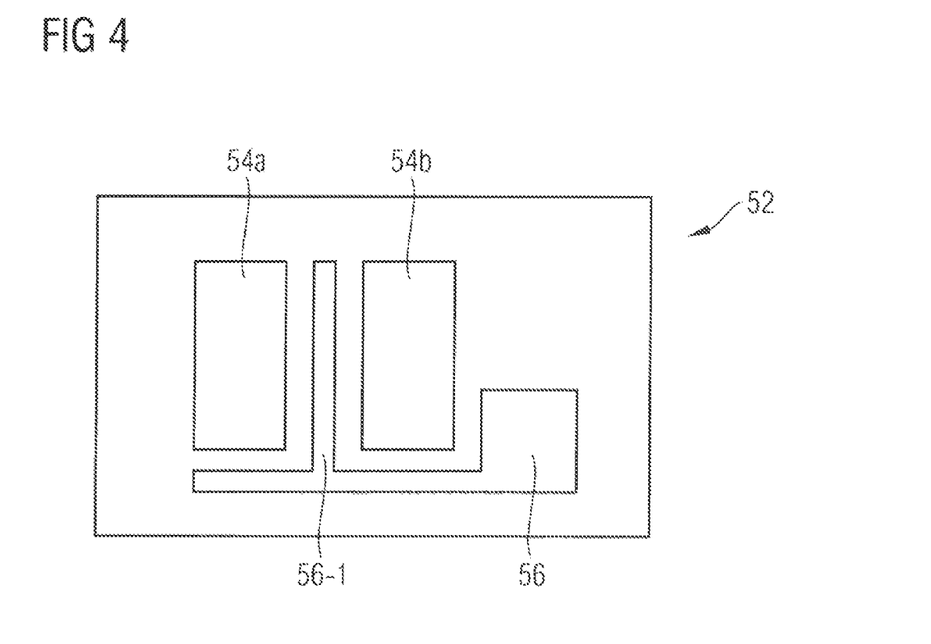
FIG. 4 schematically illustrates in a top view an exemplary layout of a power MOSFET transistor as a device under test.

FIG. 4 schematically shows a top view of part of an exemplary transistor layout for a device under test 52. DUT 52 may be a power MOSFET transistor comprising two separate source areas 54a and 54b. The separate source areas 54a and 54b are separate current input areas as they allow injecting a current into a common current channel between a source and a drain of the transistor 52. The layout further shows a gate 56 comprising a so-called gate finger or gate runner 56-1 arranged between the source areas 54a and 54b. The gate 56 is a control electrode allowing to control the current channel. Transistor 52 may be a power MOSFET of a vertical structure. A drain contact may be on the other side of the chip respectively wafer. The drain contact is not shown in FIG. 4 and may be contacted during testing from the other side, or in other words from a backside of the chip. A wafer 38 may comprise a plurality of chips with a layout 52 as shown in FIG. 4. Source areas 54a and 54b are separate source areas because they are not electrically coupled by a metallic layer on the wafer. It is only after singulating the chips and packaging that a metallization layer interconnects the separate source areas 54a and 54b. The later metallization layer may be a so-called power copper layer. A power copper layer is a metallization layer of a thickness which is configured to carry high currents. For performing the UIS test on the wafer level it is necessary to contact both separate source areas 54a and 54b to inject a drain-source current.

When the current is not injected correctly to the separate source areas, respectively to the separate current input areas, the UIS test may destroy the power transistor, respectively the power device or DUT although the transistor has no technology defects. It may be that the test conditions stress the power transistor over the rated conditions because the current is not flooding immediately the whole surface respectively volume of the current channel. During an UIS test it is important to control the electric field to be under test conditions equal to an electric field obtained during normal use. This is demanding when during the UIS test separate current input areas are not interconnected as they will be during normal use, i.e. in the packaged state.

FIG. 4 shows exemplarily two separate source areas 54a and 54b. It is to be understood that a transistor may comprise more than two separate source areas. A transistor may comprise three, four, five or more separate source areas. A transistor 52 may comprise seven separate source areas. The separate source areas may be arranged in a line and a gate finger or gate runner may be arranged between each two adjacent source areas. A transistor layout comprising seven separate source areas would thus comprise six gate fingers lying between a first source area and a second source area, between the second source area and a third source area and so on.

Although a layout of a MOSFET transistor is explained in detail, another power device, e.g. an IGBT may also comprise separate current input areas into which a test current is to be injected. Source areas 54a, 54b are to be understood as current injection or input areas for performing an UIS test.

Transistors may be provided with separate source areas for enhancing their switching speed. An example for a transistor with separate source areas may be a so-called trench MOS transistor having the gate buried in a trench. The device under test may be a trench power MOSFET.

Figure 5:
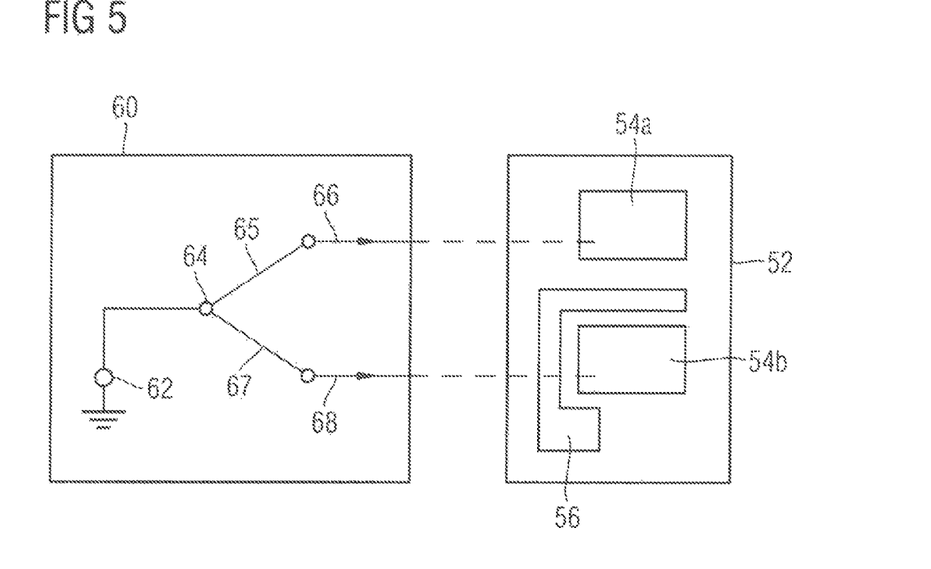
FIG. 5 schematically illustrates a probe card according to a first embodiment, the probe card being configured to contact the contact pads of the transistor shown in FIG. 4.

FIG. 5 shows a probe card 60 according to a first embodiment. Probe card 60 may be configured to perform an unclamped inductive switching test on the transistor 52 discussed with reference to FIG. 4. Probe card 60 may have any geometrical form. Probe card 60 may be of a circular form and may be configured to the form of a wafer comprising the transistor 52. It is to be understood that FIG. 5 shows very schematically the first embodiment. Probe card 60 may comprise a ground contact 62 and an interconnection node 64 directly connected to ground contact 62. It is to be understood that interconnection node 64 may be directly the ground contact 62. Probe card 60 may further comprise a first contact element 66 and a second contact element 68. Contact element 66 may be coupled to the interconnection node 64 via a first interconnection line 65 which has a definite length. Contact element 68 may be coupled to the interconnection node 64 via a second interconnection line 67 having the same definite length as the first interconnection line 65.

The first contact element 66 may be configured to contact a first contact pad on a wafer. The first contact pad may e.g. be the first source area 54a of transistor 52 as indicated by a broken line in FIG. 5. Second contact element 68 may be configured to contact a second contact pad on the wafer. The second contact pad may e.g. be the second source area 54b.

As already mentioned, the electrical field distribution inside chip 52 is important when performing an UIS test. If no homogeneous distribution can be achieved, hot spots may form during testing and provoke an avalanche breakdown leading to a short circuit although the chip does not comprise technological defects. In other words, if the distribution of the electrical current and the electrical field is not homogeneous, the test induces more failures and destroys more chips than necessary to ensure a good quality of the final transistor product to be sold. In all switching phases all source areas of transistor 52 must experience the same potential.

First and second contact elements 66 and 68 may be coupled to the interconnection node 64 and directly to the ground contact 62 provided on the probe card by the interconnection lines 65 and 67 having the same length. In other words, the first and second contact elements 66 and 68 are coupled symmetrically to ground. Furthermore, the first and second contact elements 66 and 68 are coupled over a short distance to ground, as the ground contact 62 is provided on the probe card. The symmetrical connection of both contact elements to ground over a short distance ensures that all source areas have the same electrical potential during switching. No hot spots develop and only technological defects lead to a breakdown.

The exemplary embodiment shown in FIG. 5 comprises only two separate source areas 54a and 54b. As already explained with reference to FIG. 4 a transistor layout may have more than two source areas, for example seven source areas. In this case probe card 60 may comprise seven contact elements such as 66, 68. All seven contact elements may be coupled to one interconnection node via interconnection lines. All seven interconnection lines may have the same length. Interconnection node 64 may still be connected directly to ground 62.

First and second contact elements 66 and 68 may be probe needles. More specifically, contact elements 66 and 68 may be sense needles. First and second contact elements 66 and 68 do not necessarily need to be configured to carry a high current. Contact elements 66 and 68 contribute to provide a same potential for all source areas. Contact elements 66 and 68 may be sense needles used before performing the UIS test for a four-terminal sensing to ensure a good contact of force needles to contact pads. Contact elements 66 and 68 may contact source areas 54a and 54b during the UIS test.

Figure 6:
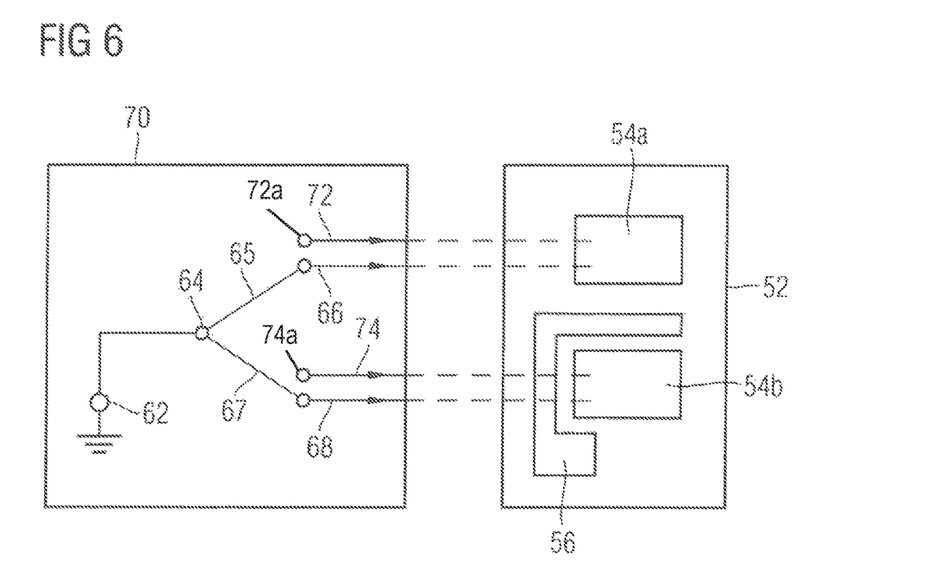
FIG. 6 schematically illustrates a probe card according to a second embodiment, the probe card being configured to contact the contact pads of the transistor shown in FIG. 4.

FIG. 6 shows a probe card 70 according to a second embodiment. Those parts shown in FIG. 6 which correspond to parts explained for probe card 60 have the same reference numerals as used in FIG. 5. They are not explained again in detail with reference to FIG. 6. Probe card 70 is configured to perform an UIS test on transistor 52 comprising a first source area 54a and a second source area 54b as well as a gate area 56. Probe card 70 comprises a ground contact 62, an interconnection point 64 directly connected to ground contact 62, a first contact element 66 and a second contact element 68 both symmetrically coupled to the interconnection point 64.

Probe card 70 further comprises a third contact element 72 and a fourth contact element 74. The third contact element 72 may be configured to contact the first contact pad on the wafer, i.e. the third contact element 72 may be configured to contact the first source area 54a. The fourth contact element 74 may be configured to contact the second contact pad on the wafer, i.e. the second source area 54b of transistor 52. Broken lines visualize the contact. It is clear from FIG. 6 and the description above that the first contact element 66 and the third contact element 72 may be configured to contact the same first contact pad on the wafer, i.e. source area 54a. Second contact element 68 and fourth contact element 74 may be configured to contact the same second contact pad on the wafer, i.e. source area 54b.

It is to be remembered that probe cards 60 and 70 may be inserted into cover 36 of test fixture 32 as shown in FIG. 2 and the transistor 54 may be part of wafer 38 held in the base 34 of the test fixture 32. Contact elements 66, 68, 72 and 74 may contact the contact pads 54a and 54b when cover 36 is closed, i.e. pivoted to base 34.

Third and fourth contact elements 72 and 74 may be probe needles. More specifically, third and fourth contact elements 72 and 74 may be force needles configured to carry a high current. Third and fourth contact elements 72 and 74 may be e.g. configured to carry about 5 A to about 6 A each. Transistor 52 may, for example, need an injected current of 10 A between source and drain for performing an UIS test. Then each of contact elements 72, 74 may carry 5 A so that a total of 10 A for the source-drain channel is achieved.

It is to be understood that transistor 52 may be a transistor with e.g. seven individual and separated source areas 54. Probe card 70 may comprise seven force needles such as 72, 74 each carrying up to 5 A. Transistor 52 may be specified to carry 35 A for the UIS test. Then, each of the force needles carry 5 A to inject 35 A to the source-drain channel.

It is possible that even more current is needed to perform an UIS test for the transistor. It is possible that for one source area, respectively one current input area, two or more force needles are needed to be able to inject enough current into the source-drain current channel. As an example, a transistor having two source areas, as shown in FIG. 6, may require a test current of about 20 A. Each contact element 72, 74 may be configured to carry a current of about 5 A. Then third contact element 72 may be doubled, and fourth contact element 74 may be doubled. In this case three contact elements may contact each source area 54, i.e. a first contact element 66 which is connected to the interconnection point 64 and two force needles 72 carrying current to the source-drain current channel.

Third and fourth contact elements 72, 74 may be connected to a ground contact 20 provided on a power supply 16 as shown in FIG. 1. Power supply 16 may be provided distant from the probe card. Power supply 16 may be part of wafer tester 30. Power supply 16 may be as well independent from test fixture 32, from probe card 40 and from wafer tester 30. An electrical line connecting third and fourth contact elements 72 and 74, via first and second probe card terminals 72a, 74a shown in FIG. 6, to power supply 16 may have a length of several meters. It might be necessary to place power supply 16 at a certain distance from probe card 60, 70 for not influencing the circuits to be tested. As explained with reference to FIG. 3, the IRS test requires very short switching times of some microseconds or even less than a microsecond. With very short switching times, the electrical lines 42 between the probe card 60, 70 and the power supply 16 may cause a non-equal potential distribution in the DUT. First and second contact elements 66 and 68 being symmetrically coupled over a very short distance to the ground contact 62 on the probe card may ensure a potential equalization.

Figure 7:
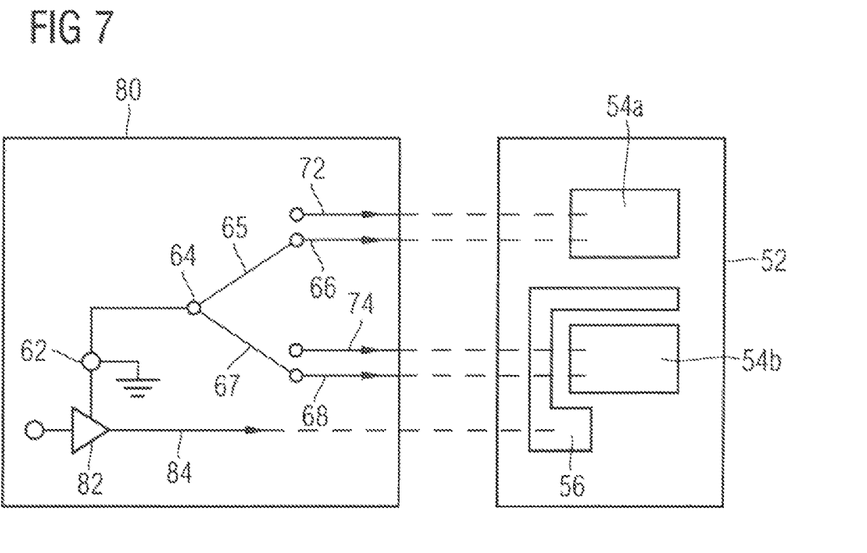
FIG. 7 schematically illustrates a probe card according to a third embodiment, the probe card being configured to contact the contact pads of the transistor shown in FIG. 4.

FIG. 7 shows a probe card 80 according to a third embodiment. Probe card 80 may be configured to perform an UIS test on chip 52. Components comprised on probe card 80 which may be equal to components comprised on probe card 60 or 70 have the same reference numerals and will not be explained further.

Probe card 80 comprises a first contact element 66 and a second contact element 68 symmetrically coupled to an interconnection node 64 which is directly connected to a ground contact 62. Probe card 80 further comprises a third contact element 72 and a fourth contact element 74 configured to carry a high current. Probe card 80 further comprises an amplifier 82. An output of amplifier 82 may be coupled to a contact element 84. Contact element 84 may be a probe needle and more specifically a force needle. Contact element 84 may be configured to contact a third contact pad 56 on chip 52. The third contact pad 56 may be a gate contact pad or more generally a control contact pad. A broken line indicates that contact element 84 is configured to contact gate contact 56 when the test fixture 34 is closed.

Amplifier 82 may be a gate driver or driver circuit. Gate driver 82 may be configured to apply a gate voltage $U_G$ onto gate pad 56. Gate driver 82 may further be configured to provide a sufficiently high current for charging rapidly a gate capacitor of transistor 52 to achieve fast switching times. An input of gate driver 82 may be coupled to a pulse generator 28 (see FIG. 1). Gate driver 82 may correspond to amplifier 26 in test circuit 1 of FIG. 1. Gate driver 82 may be arranged directly on probe card 80. Gate driver circuit 82 may be mounted on the probe card. Gate driver circuit 82 may be realized on the probe card. Thus, a length between the output of gate driver 82 and a tip of probe needle 84 is short and allows for fast switching times. Gate driver 82 may comprise a ground contact 62. The ground contact 62 of gate driver 82 may be the ground contact to which interconnection node 64 is directly coupled. Thus, a common ground contact may be used for the gate driver and for equally distributing the potential on the source areas. Ground contact 62 may correspond to the ground contact 21 of amplifier 26 shown in FIG. 1.

Figure 8:
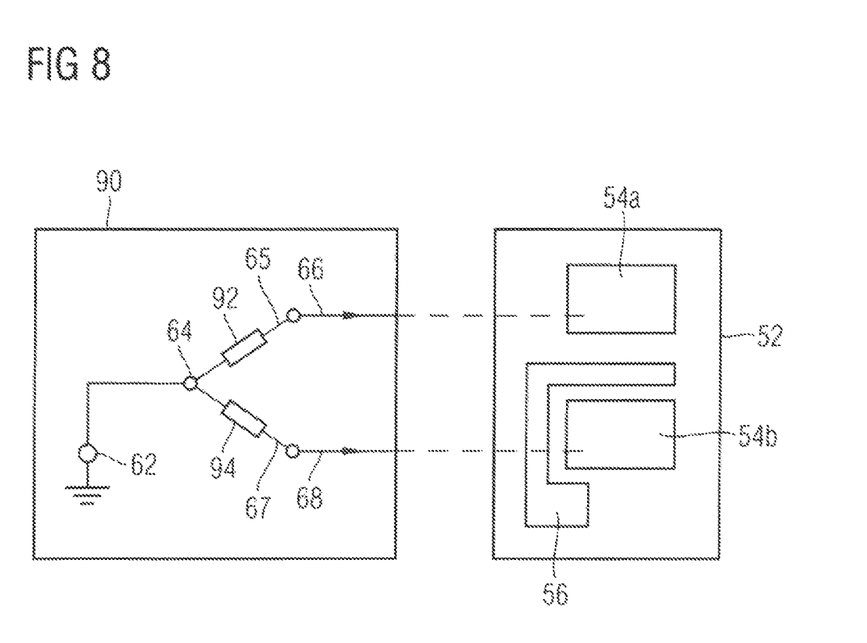
FIG. 8 schematically illustrates a probe card according to a fourth embodiment, the probe card being configured to contact the contact pads of the transistor shown in FIG. 4.

FIG. 8 shows an exemplary probe card 90 according to a fourth embodiment. The probe card 90 may be configured to perform an UIS test on chip 52. Elements which are already comprised on probe card 60, 70 and/or 80 have the same reference numerals and are not explained further. Probe card 90 comprises a first contact element 66 and a second contact element 68. Probe card 90 further comprises an interconnection node 64 and a ground contact 62 to which the interconnection node is directly connected. Interconnection line 65 comprises a first resistor 92. Interconnection line 67 comprises a second resistor 94. The first resistor 92 and the second resistor 94 may have the same definite resistance. Interconnection line 65 may have the same definite length as interconnection line 67. In other words, first contact element 66 and second contact element 68 are connected symmetrically to interconnection node 64. The resistors 92 and 94 may ensure that no current is flowing between source area 54a and source area 54b via the first contact element 66, the interconnection node 64 and the second contact element 68. Any current flowing through first and second contact elements 66 and 68 goes directly to ground contact 62. Equilibration of the potential on the different source areas is achieved via ground. The resistance of resistor 92 respectively the resistance of resistor 94 may e.g. be comprised between about 25Ω and 60Ω. The resistance value of resistor 92 and resistor 94 may be about 40Ω each. It is to be understood that the fourth embodiment shown in FIG. 8 may be combined with the second or the third embodiment shown in FIG. 6 respectively FIG. 7.

All discussed probe cards may be configured to measure transistors on wafer level comprising more than two source areas. The definite length of interconnection lines 65, 67 may be comprised between about 2 cm and about 20 cm. In an embodiment, the definite length of interconnection lines 65, 67 may e.g. be comprised between about 5 cm and about 9 cm. In an embodiment, the definite length of interconnection lines 65, 67 may e.g. be about 7 cm or more or less.

When performing the UIS test on the wafer, a current is to be injected through wafer probes. When an UIS test is already effectuated on the wafer level, components which do not withstand the UIS test do not need to be packaged, and thus packaging is avoided for unreliable chips. As described above, effectuating UIS testing of a power device on wafer level may require contacting a plurality of separate regions for injecting a test current into the device under test. The wafer subjected to UIS testing may e.g. be a semiconductor wafer or may e.g. be a composite or so-called artificial wafer comprising fan-out components that comprise packaging material surrounding the die or chip. A final redistribution layer or electrically conductive layer may not be provided on wafer level during UIS testing. Such final redistribution layer may, e.g., be applied later. By way of example, a redistribution layer which extends over the die or chip and over the packaging material surrounding the die or chip may be applied on a composite wafer e.g. at a time after testing.

Figure 9:
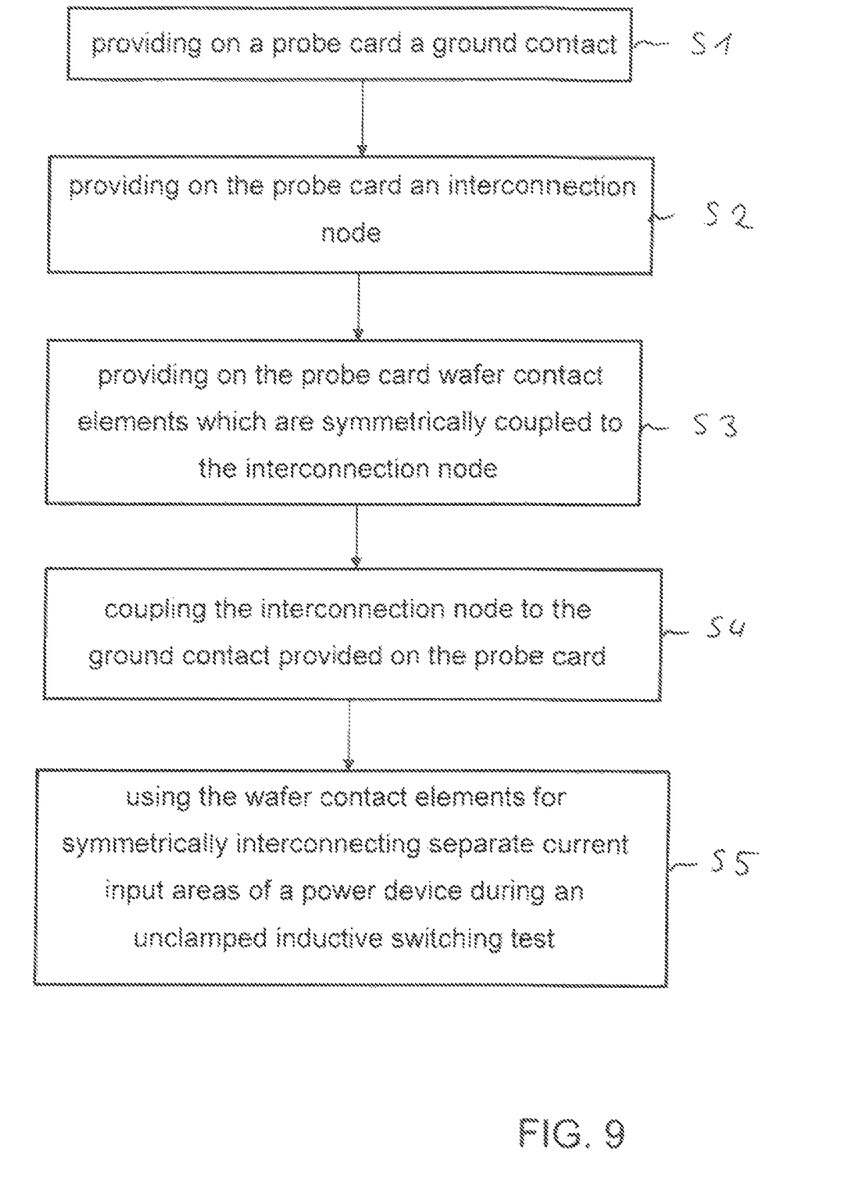
FIG. 9 shows in a flow chart a method for performing an unclamped inductive switching test according to a first embodiment.

FIG. 9 shows in a flow chart an exemplary method for performing an unclamped inductive switching test according to a first embodiment. At S1 a probe card for use in an UIS test is provided with a ground contact. At S2 the probe card is provided with an interconnection node. The interconnection node may be the ground contact itself. The interconnection node may also be provided elsewhere on the probe card at a short distance from the ground contact. At S3 the probe card is provided with wafer contact elements which are symmetrically coupled to the interconnection node. The wafer contact elements may be probe needles. Symmetrical coupling means that a same interconnection line length is used between the contact elements and the interconnection node. Symmetrically coupling may also imply inserting resistors having the same resistance into the interconnection lines. Symmetrically coupling means that the interconnection lines between each contact element and the interconnection node are electrically identical in view of resistance and electrical length.

At S4 the interconnection node is coupled to the ground contact provided on the probe card. The interconnection node is connected directly to the ground contact. At S5 the wafer contact elements may be used for symmetrically interconnecting separate contact pads, e.g. current input areas, e.g. source areas of a MOS transistor during an unclamped inductive switching test. Symmetrically interconnecting the separate current input areas may be achieved by bringing the contact elements into contact with the separate current input areas by closing the cover 36 on base 34 (FIG. 1). Symmetrically interconnecting the separate current input areas provides for same potential conditions on all interconnected current input areas. The symmetrically interconnection avoids forming of hot spots in the device under test.

Figure 10:
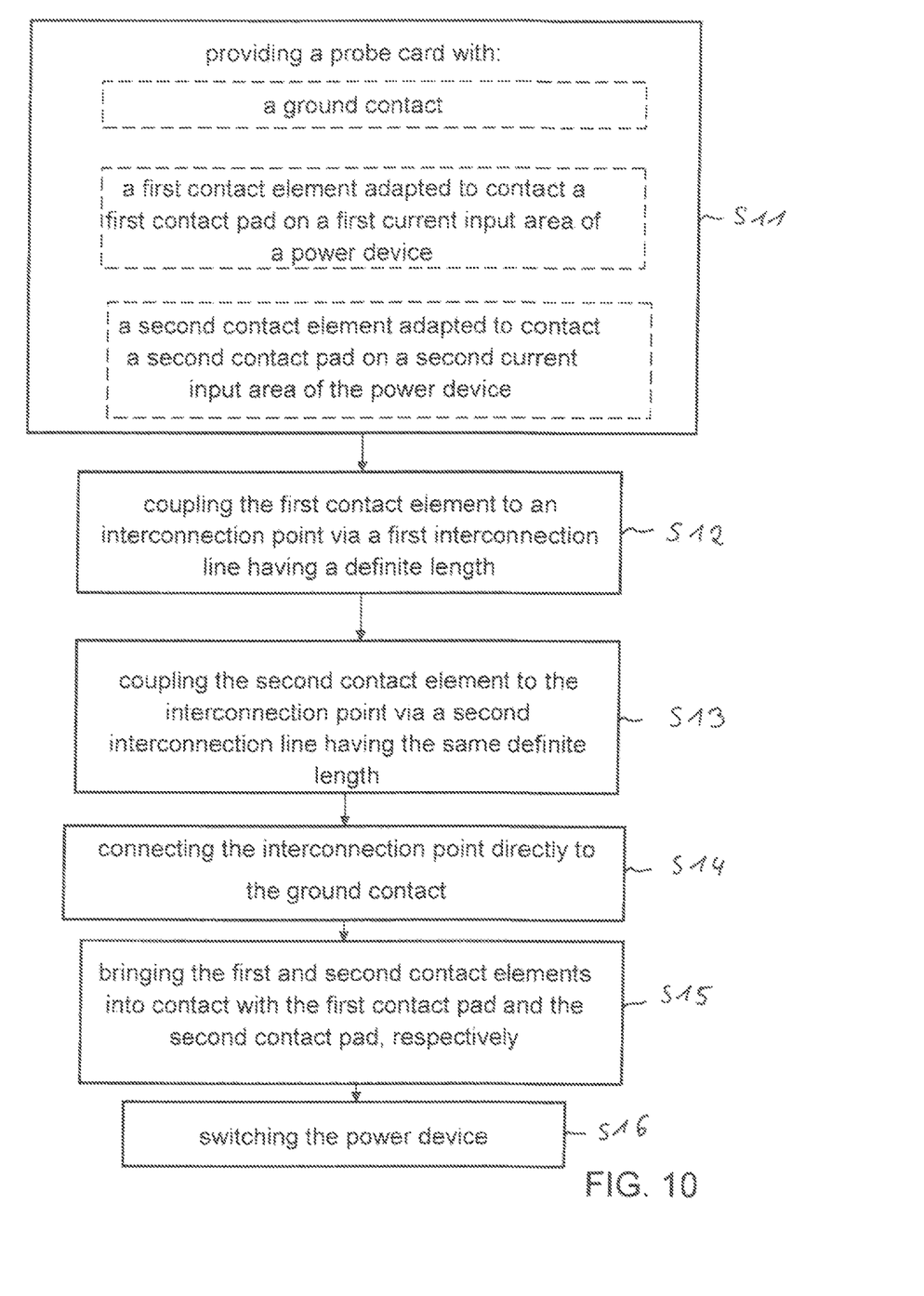
FIG. 10 shows in a flow chart a method for performing an unclamped inductive switching test according to a second embodiment.

FIG. 10 illustrates in a flow chart a method for performing an unclamped inductive switching test according to a second embodiment. At S11 a probe card is provided. The probe card comprises a ground contact, a first contact element configured to contact a first contact pad on a wafer, e.g. a first source area of a transistor, and a second contact element configured to contact a second contact pad on a wafer, e.g. a second source area of the transistor. At S12 the first contact element is coupled to an interconnection point on the probe card via a first interconnection line which has a definite length. At S13 the second contact element is coupled to the interconnection point via a second interconnection line which has the same definite length as has the first interconnection line. At S14 the interconnection point is directly connected to the ground contact. At S15 the first and second contact elements are brought into contact with the first contact pad and with the second contact pad, respectively. At S16 the transistor 52 is switched under the UIS test conditions.

While the disclosure has been illustrated and described with respect to one or more implementations, alterations and/or modifications may be made to the illustrated examples without departing from the spirit and scope of the appended claims. In particular regard to the various functions performed by the above described structures, the terms (including a reference to a "means") used to describe such structures are intended to correspond, unless otherwise indicated, to any structure which performs the specified function of the described structure (e.g., that is functionally equivalent), even though not structurally equivalent to the disclosed structure which performs the function in the herein illustrated exemplary implementations of the disclosure.

Although specific aspects have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

The invention claimed is:

1. A probe card, comprising:
a ground contact;
an interconnection node directly connected to the ground contact;
a first contact element configured to contact a first contact pad on a wafer, the first contact element coupled to the interconnection node via a first interconnection line having a definite length;
a second contact element configured to contact a second contact pad on the wafer, the second contact element coupled to the interconnection node via a second interconnection line having the same definite length as the first interconnection line;
a third contact element configured to contact the first contact pad on the wafer and coupled to a first probe card terminal so as to provide electrical connection external to the probe card; and
a fourth contact element configured to contact the second contact pad on the wafer and coupled to a second probe card terminal so as to provide electrical connection external to the probe card.

2. The probe card of claim 1, further comprising:
a driver circuit coupled to the ground contact within the probe card and having a driver output, wherein said driver output is coupled to a control contact element that is configured to contact a control contact pad on the wafer.

3. The probe card of claim 1, wherein the first interconnection line comprises a first resistor having a definite resistance and the second interconnection line comprises a second resistor having the same definite resistance.

4. The probe card of claim 3, wherein the definite resistance is between 25 Ohm and 60 Ohm.

5. The probe card of claim 1, wherein the first and the third contact elements form a first pair of contact elements configured to contact the first contact pad on the wafer, the second and the fourth contact elements form a second pair of contact elements configured to contact the second contact pad on the wafer, and the probe card further comprises additional pairs of contact elements,
wherein each additional pair is configured to contact an additional contact pad on the wafer,
wherein each additional pair comprises a first additional contact element and a second additional contact element, and
wherein the first additional contact element of each additional pair is coupled to the interconnection node via an additional interconnection line having the same definite length as the first interconnection line.

6. The probe card of claim 5, comprising at least seven pairs of contact elements configured to contact at least seven separate contact pads on the wafer.

7. The probe card of claim 1, wherein the first and the second contact elements are sense needles.

8. The probe card of claim 1, wherein the third and the fourth contact elements are force needles.

9. The probe card of claim 1, wherein the third and the fourth contact elements are configured to carry a current of about 5 Amperes.

10. The probe card of claim 1, wherein the definite length is between 2 cm and 20 cm.

11. A probe card, comprising:
a ground contact;
an interconnection node directly connected to the ground contact;
a first contact element configured to contact a first contact pad on a wafer, the first contact element coupled to the interconnection node via a first interconnection line having a definite length;
a second contact element configured to contact a second contact pad on the wafer, the second contact element coupled to the interconnection node via a second interconnection line having the same definite length as the first interconnection line; and a driver circuit coupled to the ground contact within the probe card and having a driver output, wherein said driver output is configured to contact a control contact pad on the wafer.

* * * * *